(12) United States Patent
Bai

(10) Patent No.: US 11,973,084 B2
(45) Date of Patent: Apr. 30, 2024

(54) ARRAY SUBSTRATE, MANUFACTURING METHOD THEREOF, AND DISPLAY DEVICE THEREOF

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Hubei (CN)

(72) Inventor: Dan Bai, Hubei (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 463 days.

(21) Appl. No.: 17/293,792

(22) PCT Filed: Apr. 22, 2021

(86) PCT No.: PCT/CN2021/088843
§ 371 (c)(1),
(2) Date: May 13, 2021

(87) PCT Pub. No.: WO2022/217635
PCT Pub. Date: Oct. 20, 2022

(65) Prior Publication Data
US 2022/0328534 A1    Oct. 13, 2022

(51) Int. Cl.
*H01L 27/12* (2006.01)

(52) U.S. Cl.
CPC ........ *H01L 27/1237* (2013.01); *H01L 27/127* (2013.01)

(58) Field of Classification Search
None
See application file for complete search history.

(56) References Cited

U.S. PATENT DOCUMENTS

2015/0200237 A1    7/2015   Yim
2021/0408190 A1*  12/2021  Yang ................ H10K 77/111
(Continued)

FOREIGN PATENT DOCUMENTS

CN      208848909 U    5/2019
CN      110690170 A    1/2020
(Continued)

*Primary Examiner* — Michelle Mandala
(74) *Attorney, Agent, or Firm* — PV IP PC; Wei Te Chung; Zhigang Ma

(57) ABSTRACT

The present invention discloses an array substrate, a manufacturing method thereof, and a display device thereof. The array substrate includes a substrate; a plurality of first thin film transistors, the first thin film transistors including a first gate electrode layer and a second gate electrode layer; a plurality of second thin film transistors, the second thin film transistors including a third gate electrode layer; and a gate electrode insulation layer disposed between the first gate electrode layer and the second gate electrode layer, and the third gate electrode layer located near a surface of a side of the substrate. The gate electrode insulation layer is silicon nitride material.

9 Claims, 4 Drawing Sheets

(56) References Cited

U.S. PATENT DOCUMENTS

2021/0408192 A1* 12/2021 Zhang ................. H01L 27/1251
2022/0320219 A1* 10/2022 Zheng ................ H10K 59/1216

FOREIGN PATENT DOCUMENTS

| CN | 111564458 A | 8/2020 |
| CN | 111863838 A | 10/2020 |
| CN | 112366210 A | 2/2021 |
| KR | 20150084573 A | 7/2015 |

* cited by examiner

ARRAY SUBSTRATE, MANUFACTURING METHOD THEREOF, AND DISPLAY DEVICE THEREOF

CROSS-REFERENCE TO RELATED APPLICATIONS

This application is a 371 U.S. National Stage of International Application No. PCT/CN2021/088843, filed on Apr. 22, 2021, which claims priority to Chinese Application No. 202110389441.5, filed on Apr. 12, 2021. The entire disclosures of the above applications are incorporated herein by reference.

FIELD OF INVENTION

The present application relates to a field of displays, specifically to an array substrate, a manufacturing method thereof, and a display device thereof.

BACKGROUND OF INVENTION

At present, market demand for long-lasting products is increasing, and low temperature polycrystalline oxide (LTPO) technology, as a low power consumption display technology, has been widely watched by the industry. The LTPO technology combines low temperature polycrystalline (LTPS) thin film transistors (TFT) and oxide TFTs (indium gallium zinc oxide, IGZO). Compared to conventional LTPS backplates in use, the LTPO can lower power consumption by about 5-15%.

SUMMARY OF INVENTION

To solve the above technical issue, the present invention provides an array substrate, a manufacturing method thereof, and a display device thereof to solve the technical issue that hydrogen diffusion in the conventional low temperature polycrystalline oxide technology results in conductorization of an oxide conductor layer to cause failure of an array substrate.

A technical solution solving the above technical issue is that: the present invention provides an array substrate, comprising:
 a substrate;
 a plurality of first thin film transistors disposed on the substrate, the first thin film transistors comprising a first gate electrode layer and a second gate electrode layer, and the second gate electrode layer disposed on a side of the first gate electrode layer away from the substrate;
 a plurality of second thin film transistors disposed on the substrate, and the second thin film transistors comprising a third gate electrode layer; and
 a gate electrode insulation layer disposed between the first gate electrode layer and the second gate electrode layer and on a surface of a side of the third gate electrode layer near the substrate, and the gate electrode insulation layer being silicon nitride material.

Optionally, in some embodiments of the present application, the array substrate further comprises a first insulation layer, a first dielectric layer, a second insulation layer, a second dielectric layer, and a passivation layer sequentially stacked on one another.

Optionally, in some embodiments of the present application, the first thin film transistors further comprise: a first active layer disposed on the substrate, and the first insulation layer covering the first active layer; the first gate electrode layer disposed on a surface of a side of the first insulation layer away from the substrate; the gate electrode insulation layer disposed on a surface of a side of the first gate electrode layer away from the first insulation layer; a second gate electrode layer disposed on a surface of a side of the first gate electrode layer away from the gate electrode insulation layer; the first dielectric layer disposed on the surface of the side of the first insulation layer away from the substrate, and covering the first gate electrode layer, the gate electrode insulation layer and the second gate electrode layer; and a first source and drain electrode disposed on a surface of a side of the second dielectric layer away from the second insulation layer, and connected to the first active layer.

Optionally, in some embodiments of the present application, the second thin film transistors further comprise: a metal layer disposed on the substrate, and disposed with the first active layer on the same layer; the third gate electrode layer disposed on the gate electrode insulation layer; a second active layer disposed on a surface of a side of the first dielectric layer away from the first insulation layer, and the second insulation layer covering the second active layer; a fourth gate electrode layer disposed on a surface of a side of the second insulation layer away from the first dielectric layer, and the second dielectric layer covering the fourth gate electrode layer; and a second source and drain electrode disposed on a surface of a side of the second dielectric layer away from the second insulation layer, and connected to the second active layer and the metal layer.

Optionally, in some embodiments of the present application, material of the second gate electrode layer and the third gate electrode layer is molybdenum titanium alloy.

Optionally, in some embodiments of the present application, the array substrate further comprises: a first planarization layer disposed on a surface of a side of the passivation layer away from the second dielectric layer; a pixel electrode disposed on the first planarization layer, and partially penetrating the first planarization layer to connect with the first source and drain electrode; a second planarization layer disposed on a surface of a side of the first planarization layer away from the passivation layer, and covering the pixel electrode; a pixel definition layer disposed on a surface of a side of the second planarization layer away from the first planarization layer, and a pixel hole defined in a portion of the pixel definition layer corresponding to the pixel electrode; and a light emitting layer disposed in the pixel hole, and connected to the pixel electrode.

Optionally, in some embodiments of the present application, the array substrate further comprises a displaying region and a folding region, the first thin film transistors and the second thin film transistors are disposed in the displaying region, the substrate, the first insulation layer, the first dielectric layer, the second insulation layer, the second dielectric layer, and the passivation layer extend from the displaying region into the folding region; and a hole is defined in the folding region, the hole penetrates the passivation layer, the second dielectric layer, the second insulation layer, the first dielectric layer, the first insulation layer, and a portion of the substrate, and the first planarization layer is filled in the hole.

Accordingly, the embodiment of the present application also provides an array substrate manufacturing method, comprising steps as follows:
 providing a substrate; manufacturing several first thin film transistors and several second thin film transistors on the substrate, wherein the step of manufacturing several first thin film transistors and second thin film transistors comprises: manufacturing a first gate electrode layer of the first thin film transistors; manufacturing a layer of gate electrode insulation material on the first gate electrode layer, wherein the gate electrode insulation material is silicon nitride material; etching the gate electrode insulation material and the first insulation layer to form a contact hole corresponding to the first active layer and the metal layer, and annealing at a temperature from 350 to 400 degrees Celsius; manufacturing a second gate electrode layer of the first thin film transistors and a third gate electrode layer of the second thin film transistors on the gate electrode insulation material; and etching the gate electrode insulation material by using self-alignment of the second gate electrode layer and the third gate electrode layer, and acquiring a gate electrode insulation layer.

Optionally, in some embodiments of the present application, before the step of manufacturing a first gate electrode layer of the first thin film transistors, the method further comprises steps as follows: manufacturing a layer of semiconductor material on the substrate, and patterning to form a first active layer of the first thin film transistors and a metal layer of the second thin film transistors; and manufacturing a layer of a first insulation layer on the substrate, wherein the first insulation layer covers the first active layer and the metal layer.

Optionally, in some embodiments of the present application, after the step of acquiring a gate electrode insulation layer, the method further comprises steps as follows: manufacturing a first dielectric layer on the first insulation layer, wherein the first dielectric layer covers the first gate electrode layer, the gate electrode insulation layer, the second gate electrode layer, and the third gate electrode layer; manufacturing a second active layer of the second thin film transistors on the first dielectric layer; manufacturing a layer of a second insulation layer on the first dielectric layer, wherein the second insulation layer covers the second active layer; manufacturing a fourth gate electrode layer on the second insulation layer, wherein the fourth gate electrode layer corresponds to the third gate electrode layer; manufacturing a second dielectric layer on the second insulation layer, wherein the second dielectric layer covers the fourth gate electrode layer; etching the second dielectric layer, the second insulation layer, the first dielectric layer, and the first insulation layer to form several first via holes and second via holes, wherein the first via holes correspond to the first active layer of the first thin film transistors, and the second via holes correspond to the metal layer and the second active layer of the second thin film transistors; and manufacturing a first source and drain electrode and a second source and drain electrode on the second dielectric layer, wherein the first source and drain electrode penetrates the first via holes and is connected to the first active layer, and the second source and drain electrode penetrates the second via holes and is connected to the metal layer and the second active layer.

Accordingly, the embodiment of the present application further provides a display device, comprising a color filter substrate, the above array substrate, and a backlight module.

Advantages of the embodiment of the present application are that an array substrate, a manufacturing method thereof, and a display device thereof of the embodiment of the present application employ silicon nitride material with a greater amount of hydrogen to serve as a gate electrode insulation layer, can supply an active layer of polysilicon material with hydrogen under a high temperature condition. Furthermore, a gate electrode insulation layer is disposed below an active layer of an oxide thin film transistor and is completely covered by a gate electrode layer of the oxide thin film transistor, which would not cause conductorization of the active layer in the oxide thin film transistor such that no adverse influence is caused to the oxide thin film transistor while a performance of low temperature polysilicon thin film transistor is increased, and device performance of the oxide thin film transistor and the polysilicon thin film transistor is improved.

DESCRIPTION OF DRAWINGS

Specific embodiments of the present invention are described in details with accompanying drawings as follows to make technical solutions and advantages of the present invention clear.

Figure 1:
FIG. 1 is a structural schematic view of a display device of an embodiment.

Reference numbers are as follows:
array substrate 10; color filter substrate 20;
displaying region 101; folding region 102;
substrate 100; first thin film transistors 200;
second thin film transistors 300; first insulation layer 410;
first dielectric layer 420; second insulation layer 430;
second dielectric layer 440; passivation layer 450;
first planarization layer 460; gate electrode insulation layer 500;
first pixel electrode 600; second pixel electrode 700;
second planarization layer 470; retaining wall 480;
light emitting layer 800; first flexible layer 110;
first buffer layer 120; second flexible layer 130;
second buffer layer 140; barrier layer 150;
first active layer 210; first gate electrode layer 220;
second gate electrode layer 230; first source and drain electrode 240;
metal layer 301; third gate electrode layer 310;
second active layer 320; fourth gate electrode layer 330;
second source and drain electrode 340; hole 1021;
first contact hole 411; first via hole 412;
second via hole 413.

DETAILED DESCRIPTION OF EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when are not specified to the contrary explanation, usually refer to the upper and lower states of the device in actual use or working conditions, specifically according to the direction of the figures in the drawings. Furthermore, "inner" and "outer" refer to the outline of the device.

Embodiments

Figure 2:
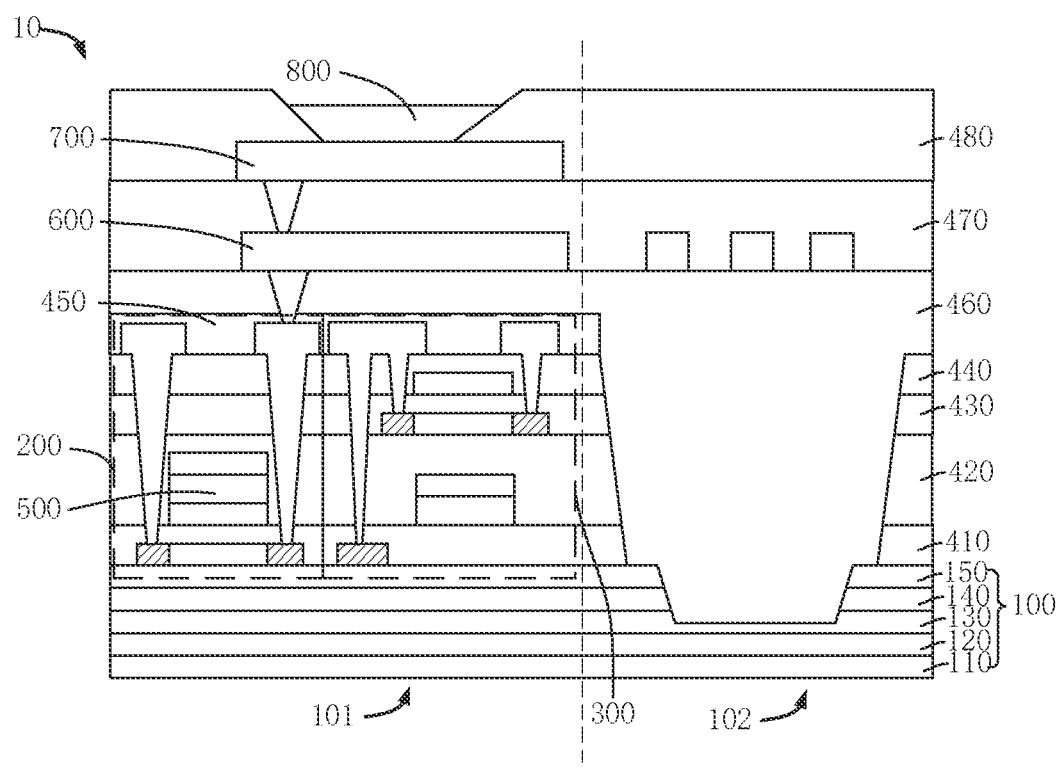
FIG. 2 is a structural schematic view of an array substrate of the embodiment.

With reference to FIG. 1, in the present embodiment, a display device of the present invention comprises an array substrate 10 and a color filter substrate 20. With reference to FIG. 2, the array substrate 10 comprises a substrate 100, first thin film transistors 200, second thin film transistors 300, a first insulation layer 410, a first dielectric layer 420, a second insulation layer 430, a second dielectric layer 440, a passivation layer 450, a first planarization layer 460, a gate electrode insulation layer 500, a first pixel electrode 600, a second pixel electrode 700, a second planarization layer 470, a retaining wall 480, and a light emitting layer 800.

The substrate 100 is a dual-layer flexible substrate, and comprises a first flexible layer 110, a first buffer layer 120, a second flexible layer 130, a second buffer layer 140, and a barrier layer 150 that are stacked on one another.

The first thin film transistors 200 and the second thin film transistors 300 are disposed on a surface of a side of the barrier layer 150 away from the second buffer layer 140. The first thin film transistors 200 and the second thin film transistors 300 are disposed adjacent to each other and are insulative from each other, wherein the first thin film transistors 200 are low temperature polysilicon thin film transistors, and the first thin film transistors 200 are driver thin film transistors to perform a function of driving a pixel circuit. The second thin film transistors 300 are oxide thin film transistors, and the second thin film transistors 300 are switch thin film transistors to perform a function of switching the pixel circuit signal on or off.

Specifically, the first thin film transistors 200 comprise layer a first active layer 210, a first gate electrode layer 220, a second gate electrode layer 230, and a first source and drain electrode 240 stacked on one another.

The second thin film transistors 300 comprise a metal layer 301, a third gate electrode layer 310, a second active layer 320, a fourth gate electrode layer 330, and a second source and drain electrode 340 stacked on one another.

The first active layer 210 employs a low temperature polysilicon technology to evenly irradiate amorphous silicon with a laser, then the amorphous silicon absorbs internal atoms and undergoes energy level transitions to transform into a polycrystal structure. Employment of the low temperature polysilicon technology can greatly increase electron mobility of the first thin film transistors 200 such that the display device has a higher resolution, a faster response speed, and a greater brightness.

The first insulation layer 410 covers the first active layer 210, material of the first insulation layer 410 is silicon oxide material having a technical effect of isolating water and oxygen, which effectively prevents the first active layer 210 from corrosion due to water and oxygen.

The first gate electrode layer 220 is disposed on an upper surface of the first insulation layer 410. Material of the first gate electrode layer 220 is metal material, and the metal material comprises molybdenum (Mo), aluminum (Al), copper (Cu), titanium (Ti), etc., or alloys thereof, or a multilayer thin film structure. A thickness of the first gate electrode layer 220 is 2000 to 8000 Å.

Because the thin film transistor of the single gate structure has weak carrier control of the active layer, it causes poor carrier mobility and drift of the threshold voltage, which further results in instability of electrical performance of the driver circuit of the array substrate.

Therefore, in the present embodiment, both the first thin film transistors 200 and the second thin film transistors 300 employ dual-gate structures. Applying electrical signals simultaneously to two layers of the gate electrode layers can drastically increase the carrier mobility of the first thin film transistors 200 and the second thin film transistors 300 and solve the drift issue of the threshold voltage of the first thin film transistors 200 and the second thin film transistors 300, which enhances stability of electrical performance of the thin film transistor and further enhances stability of electrical performance of the driver circuit of the array substrate.

To prevent a shorting phenomenon from occurring between the first gate electrode layer 220 and the second gate electrode layer 230, usually a gate electrode insulation layer is added between two layers of the gate electrode. In the present embodiment, a gate electrode insulation layer 500 is disposed between the first gate electrode layer 220 and the second gate electrode layer 230, and material of the gate electrode insulation layer 500 is silicon nitride material. The silicon nitride material has a greater amount of hydrogen, can supply hydrogen under a high temperature condition, and can supply the first active layer 210 manufactured by a low temperature polysilicon technology with hydrogen such that a requirement of the low temperature polysilicon technology is satisfied to guarantee the performance of the first active layer 210.

However, the second thin film transistors 300 are oxide thin film transistors, and the second active layer 320 thereof employs oxide conductor material. In the present embodiment, material employed by the second active layer 320 is indium gallium zinc oxide (IGZO), indium gallium zinc oxide material is sensitive to ambient atmosphere, for example, hydrogen, oxygen, water, etc. Hydrogen diffused into channels in the second active layer 320 would result in conductorization of indium gallium zinc oxide. Intrusion of water and oxygen results in shifting of a threshold voltage of the second thin film transistors 300 such that the TFT fails. To prevent detached hydrogen out of the gate electrode insulation layer 500 under a high temperature process from entering the second active layer 320, the third gate electrode layer 310 of the second thin film transistors 300 and the second gate electrode layer 230 of the first thin film transistors 200 are disposed on the same layer. The gate electrode insulation layer 500 is disposed on lower surfaces of the second gate electrode layer 230 and the third gate electrode layer 310, and is completely covered by the second gate electrode layer 230 and the third gate electrode layer 310.

The first dielectric layer 420 is disposed on an upper surface of the first insulation layer 410, and the first dielectric layer 420 covers the first gate electrode layer 220, the gate electrode insulation layer 500, the second gate electrode layer 230, and the third gate electrode layer 310. The first dielectric layer 420 is an interlayer insulation layer, material of the first dielectric layer 420 is inorganic material, the inorganic material comprises silicon oxide or silicon nitride, or a multi-layer thin film structure to perform an insulation function to prevent shorting of a circuit. A thickness of the first dielectric layer 420 is 2000 Å to 10000 Å.

The second active layer 320 is disposed on an upper surface of the first dielectric layer 420, the second insulation layer 430 covers the second active layer 320, material and functions of the second insulation layer 430 are similar to those of the first insulation layer 410, and both have a technical effect of water and oxygen insulation.

The fourth gate electrode layer 330 is disposed on an upper surface of the second insulation layer 430, and is disposed opposite to the third gate electrode layer 310. Applying electrical signals simultaneously to the third gate electrode layer 310 and the fourth gate electrode layer 330 can drastically increase the carrier mobility of the second thin film transistors 300 and solve the drift issue of the threshold voltage of the second thin film transistors 300, which enhances stability of electrical performance of the thin film transistor and further enhances stability of electrical performance of the driver circuit of the array substrate.

The second dielectric layer 440 is disposed on the upper surface of the second insulation layer 430, and covers the fourth gate electrode layer 330. Material and functions of the second dielectric layer 440 are the same as material and functions of the first dielectric layer 420, and both perform an insulation function to prevent shorting of the circuit.

The first source and drain electrode 240 and the second source and drain electrode 340 are disposed on an upper surface of the second dielectric layer 440. The first source and drain electrode 240 corresponds to the first active layer 210, and partially penetrates the second dielectric layer 440. The second insulation layer 430, the first dielectric layer 420, and the first insulation layer 410 are connected to the first active layer 210.

The second source and drain electrode 340 corresponds to the second active layer 320, and partially penetrates the second dielectric layer 440. The second insulation layer 430 is connected to the second active layer 320.

The metal layer 301 is disposed on the upper surface of the substrate 100 and is disposed on the same layer on which the first active layer 210 is disposed. The metal layer 301 is a conductorized semiconductor layer. The second source and drain electrode 340 partially penetrates the second dielectric layer 440. The second insulation layer 430, the first dielectric layer 420, and the first insulation layer 410 are connected to the metal layer 301 and are configured to prevent adverse effect due to Schottky contact.

The passivation layer 450 is disposed on the upper surface of the second dielectric layer 440. Material of the passivation layer 450 comprises oxide material of silicon. A thickness of the passivation layer 450 is 1000 Å to 5000 Å. The passivation layer 450 performs an insulation function and a water and oxygen insulation function.

In the present embodiment, the array substrate 10 comprises a displaying region 101 and a folding region 102 disposed below the displaying region 101. The first thin film transistors 200, the second thin film transistors 300, and the gate electrode insulation layer 500 are disposed in the displaying region 101. The substrate 100, the first insulation layer 410, the first dielectric layer 420, the second insulation layer 430, the second dielectric layer 440, the passivation layer 450, the first planarization layer 460, the second planarization layer 470, and the retaining wall 480 extend from the displaying region 101 into the folding region 102.

A hole 1021 is defined in the folding region 102, the hole 1021 penetrates the passivation layer 450, the second dielectric layer 440, the second insulation layer 430, the first dielectric layer 420, the first insulation layer 410, and a portion of the substrate 100.

The first planarization layer 460 is disposed on an upper surface of the passivation layer 450, and extends from the displaying region 101 into the folding region 102. The first planarization layer 460 is filled into the hole 1021, the first planarization layer 460 employs inorganic material with a higher tenacity, which effectively prevents rupture resulting from folding stress when the folding region 102 is folded and improves the lifespan of the array substrate 10.

The first pixel electrode 600 is disposed on an upper surface of the first planarization layer 460, the first pixel electrode 600 corresponds to the first thin film transistors 200, penetrates the first planarization layer 460 and the passivation layer 450, and is connected to the first source and drain electrode 240. In the folding region 102, several metal wires are further disposed on the upper surface of the first planarization layer 460, and the metal wires are disposed over the hole.

The second planarization layer 470 is disposed on an upper surface of the first planarization layer 460 and covers the first pixel electrode 600. The second pixel electrode 700 is disposed on an upper surface of the second planarization layer 470. The second pixel electrode 700 corresponds to the first pixel electrode 600, partially penetrates the second planarization layer 470, and is connected to the first pixel electrode 600 to achieve electrical signal transmission between the first pixel electrode 600 and the second pixel electrode 700.

The retaining wall 480 is disposed on an upper surface of the second planarization layer 470. A pixel hole is defined in a portion of the retaining wall 480 corresponding to the second pixel electrode 700. The light emitting layer 800 is disposed in the pixel hole and is electrically connected to the second pixel electrode 700.

For better explanation of the present invention, the present embodiment further provides a manufacturing method for the above array substrate 10, and specific steps thereof are as follows:

A step S1) comprises providing a substrate, wherein the substrate 100 is a dual-layer flexible substrate and comprises a first flexible layer 110, a first buffer layer 120, a second flexible layer 130, a second buffer layer 140, and a barrier layer 150 stacked on one another.

Figure 3:
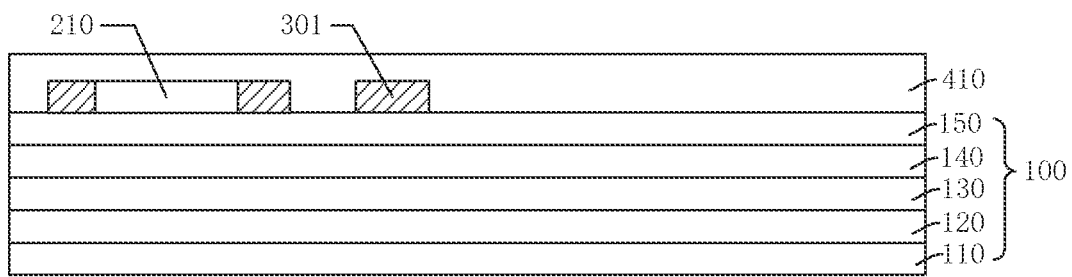
FIG. 3 is a structural schematic view of an array substrate of step S201 of the embodiment.

A step S2) comprises manufacturing several first thin film transistors 200 and several second thin film transistors 300 on the substrate 100, wherein the step of manufacturing the first thin film transistors 200 and the second thin film transistors 300 comprises the following steps:

A step S201), with reference to FIG. 3, comprises manufacturing a layer of semiconductor material on the substrate 100, patterning to form a first active layer 210 of the first thin film transistors 200 and a metal layer 301 of the second thin film transistors.

A step S202) comprises manufacturing a layer of a first insulation layer 410 on the substrate 100, wherein the first insulation layer 410 covers the first active layer 210 and the metal layer 301.

A step S203) comprises manufacturing a layer of gate electrode material on an upper surface of the first insulation layer 410, and patterning to form a first gate electrode layer 220 of the first thin film transistors 200.

Figure 4:
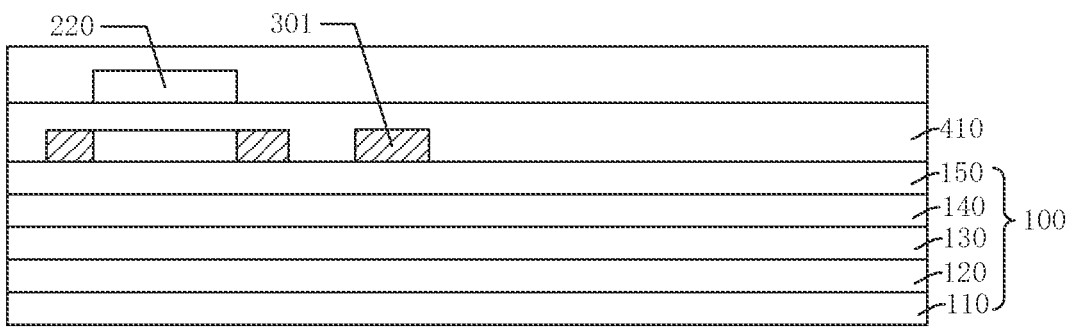
FIG. 4 is a structural schematic view of the array substrate of step S204 of the embodiment.

A step S204), with reference to FIG. 4, comprises manufacturing a layer of gate electrode insulation material on the first gate electrode layer 220, wherein the gate electrode insulation material is silicon nitride material.

Figure 5:
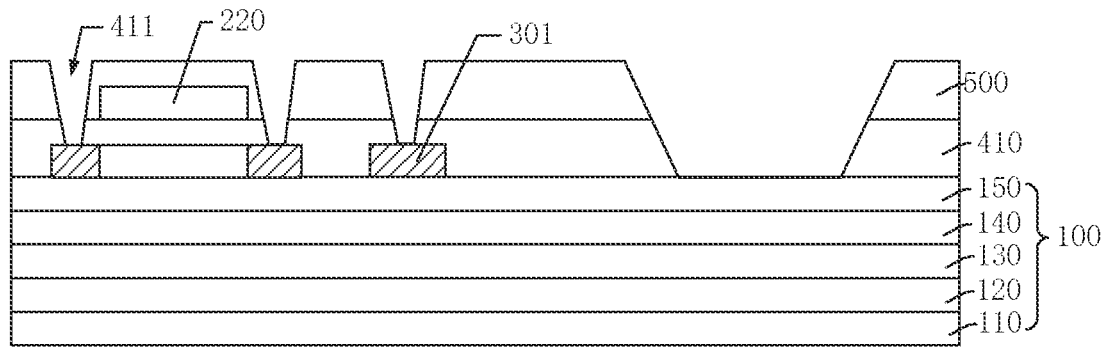
FIG. 5 is a structural schematic view of the array substrate of step S205 of the embodiment.

A step S205), with reference to FIG. 5, comprises etching the gate electrode insulation material and the first insulation layer 410 to form first contact holes 411 corresponding to the first active layer 210 and the metal layer 301, annealing the gate electrode insulation material at a temperature from 350 to 400 degrees Celsius such that hydrogen in the gate electrode insulation material is detached under a high temperature, supplying the first active layer 210 and the metal layer 301 with hydrogen through the first contact holes 411. During etching the first contact holes 411, the gate electrode material and the first insulation layer 410 in folding region 102 are also etched simultaneously to form a first deep hole.

A step S206) comprises manufacturing a layer of gate electrode material on the gate electrode insulation material, and patterning to form a second gate electrode layer 230 of the first thin film transistors and a third gate electrode layer 310 of the second thin film transistors.

A step S207) comprises using the second gate electrode layer 230 and the third gate electrode layer 310 to implement self-alignment, etching the gate electrode insulation material, and acquiring gate electrode insulation layer 500.

A step S208) comprises manufacturing a first dielectric layer 420 on the first insulation layer 410, wherein the first dielectric layer 420 covers the first gate electrode layer 220, the gate electrode insulation layer 500, the second gate electrode layer 230, and the third gate electrode layer 310.

A step S209) comprises manufacturing a second active layer 320 of the second thin film transistors 300 on the first dielectric layer 420, wherein the second active layer 320 corresponds to the third gate electrode layer 310.

A step S210) comprises manufacturing a layer of a second insulation layer 430 on the first dielectric layer 420, wherein the second insulation layer 430 covers the second active layer 320.

A step S211) comprises manufacturing a fourth gate electrode layer 330 on the second insulation layer 430, wherein the fourth gate electrode layer 330 corresponds to the third gate electrode layer 310.

A step S212) comprises manufacturing a second dielectric layer 440 on the second insulation layer 430, wherein the second dielectric layer 440 covers the fourth gate electrode layer 330.

Figure 6:
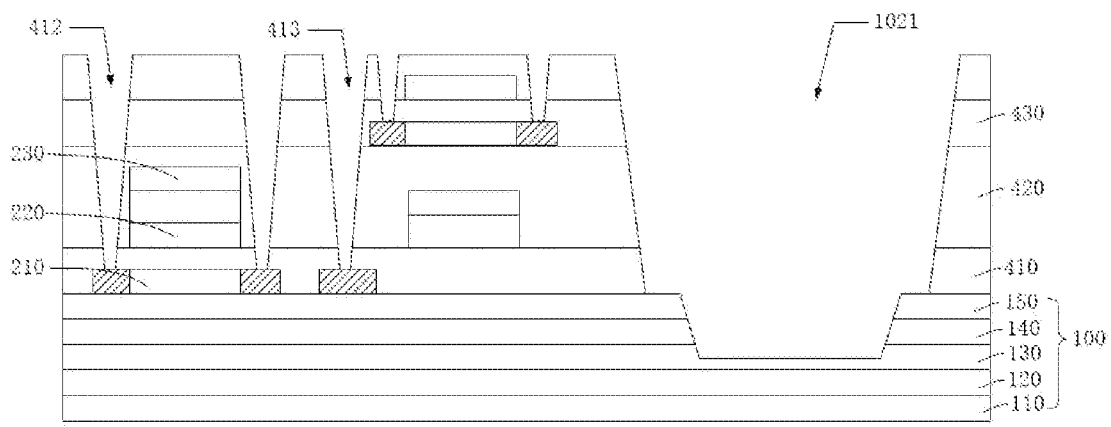
FIG. 6 is a structural schematic view of the array substrate of step S213 of the embodiment.

A step S213), with reference to FIG. 6, comprises etching the second dielectric layer 440, the second insulation layer 430, the first dielectric layer 420, and the first insulation layer 410 to form several first via holes 412 and second via holes 413. The first via holes 412 correspond to the first active layer 210 of the first thin film transistors, and coincide with the first contact holes 411. The second via holes 413 correspond to a metal layer 301 of the second thin film transistors and a second active layer 320.

A step S214) comprises manufacturing a first source and drain electrode 240 and a second source and drain electrode 340 on the second dielectric layer 440, wherein the first source and drain electrode 240 penetrates the first via holes 412 and is connected to the first active layer 210, and the second source and drain electrode 340 penetrates the second via holes 413 and is connected to the metal layer 301 and the second active layer 320. During etching the first via holes 412 and the second via holes 413, the folding region 102 is etched simultaneously to form a hole 1021.

A step S3) comprises manufacturing a passivation layer 450 on an upper surface of the second dielectric layer 440, wherein the passivation layer 450 covers the first source and drain electrode 240 and the second source and drain electrode 340.

Figure 7:
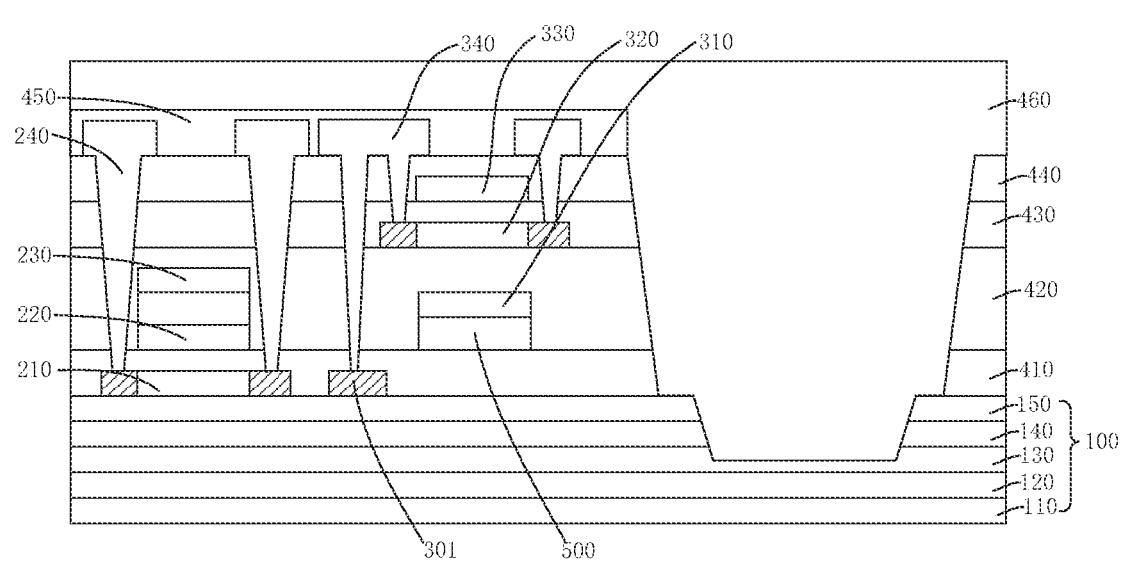
FIG. 7 is a structural schematic view of the array substrate of a step S4 of the embodiment.

A step S4), with reference to FIG. 7 comprises manufacturing a first planarization layer 460 on an upper surface of the passivation layer, wherein the first planarization layer 460 extend in the folding region 102 and is filled in the hole 1021.

Advantages of the embodiment of the present application are that an array substrate, a manufacturing method thereof, and a display device thereof of the embodiment of the present application employ silicon nitride material with a greater amount of hydrogen to serve as a gate electrode insulation layer, which can supply an active layer of polysilicon material with hydrogen under a high temperature condition. Furthermore, a gate electrode insulation layer is disposed below an active layer of an oxide thin film transistor and is completely covered by a gate electrode layer of the oxide thin film transistor, which would not cause conductorization of the active layer in the oxide thin film transistor such that no adverse influence is caused to the oxide thin film transistor while a performance of low temperature polysilicon thin film transistor is increased, and device performance of the oxide thin film transistor and the polysilicon thin film transistor is improved The description of the above embodiments is only for assisting understanding of the technical solutions of the present application and the core ideas thereof. Those of ordinary skill in the art should understand that they can still modify the technical solutions described in the foregoing embodiments are or equivalently replace some of the technical features. These modifications or replacements do not depart from the essence of the technical solutions of the embodiments of the present application.

What is claimed is:

1. An array substrate, comprising:
a substrate;
a plurality of first thin film transistors disposed on the substrate, the first thin film transistors comprising a first gate electrode layer and a second gate electrode layer, and the second gate electrode layer disposed on a side of the first gate electrode layer away from the substrate;
a plurality of second thin film transistors disposed on the substrate, the second thin film transistors comprising a third gate electrode layer; and
a gate electrode insulation layer disposed between the first gate electrode layer and the second gate electrode layer and on a surface of a side of the third gate electrode layer near the substrate, the gate electrode insulation layer being silicon nitride material;
wherein the first thin film transistors further comprise:
a first active layer disposed on the substrate, a first insulation layer covering the first active layer;
the first gate electrode layer disposed on a surface of a side of the first insulation layer away from the substrate;
the gate electrode insulation layer disposed on a surface of a side of the first gate electrode layer away from the first insulation layer;
the second gate electrode layer disposed on a surface of a side of the first gate electrode layer away from the gate electrode insulation layer;
a first dielectric layer disposed on the surface of the side of the first insulation layer away from the substrate and covering the first gate electrode layer, the gate electrode insulation layer, and the second gate electrode layer; and a first source and drain electrode disposed on a surface of a side of a second dielectric layer away from the second insulation layer, and connected to the first active layer;

wherein the second thin film transistors further comprise:
a metal layer disposed on the substrate, and disposed on a same layer as the first active layer;
the third gate electrode layer disposed on the gate electrode insulation layer;
a second active layer disposed on a surface of a side of the first dielectric layer away from the first insulation layer, a second insulation layer covering the second active layer;
a fourth gate electrode layer disposed on a surface of a side of a second insulation layer away from the first dielectric layer, a second dielectric layer covering the fourth gate electrode layer; and
a second source and drain electrode disposed on a surface of a side of a second dielectric layer away from the second insulation layer ,and connected to the second active layer and the metal layer.

2. The array substrate according to claim 1, further comprising a passivation layer, and the first insulation layer, the first dielectric layer, the second insulation layer, the second dielectric layer, and the passivation layer are sequentially stacked on one another.

3. The array substrate according to claim 1, further comprising:
a first planarization layer disposed on a surface of a side of a passivation layer away from a second dielectric layer;
a pixel electrode disposed on the first planarization layer and partially penetrating the first planarization layer to connect with a first source and drain electrode;
a second planarization layer disposed on a surface of a side of the first planarization layer away from the passivation layer and covering the pixel electrode;
a pixel definition layer disposed on a surface of a side of the second planarization layer away from the first planarization layer, and a pixel hole defined in a portion of the pixel definition layer corresponding to the pixel electrode; and
a light emitting layer disposed in the pixel hole and connected to the pixel electrode.

4. The array substrate according to claim 3, wherein the array substrate further comprises a displaying region and a folding region; the first thin film transistors and the second thin film transistors are disposed in the displaying region; the substrate, the first insulation layer, the first dielectric layer, the second insulation layer, the second dielectric layer, and the passivation layer extend from the displaying region into the folding region; and
a hole is defined in the folding region, the hole penetrates the passivation layer, the second dielectric layer, the second insulation layer, the first dielectric layer, the first insulation layer, and a portion of the substrate, and the first planarization layer is filled in the hole.

5. An array substrate manufacturing method, comprising steps as follows:
providing a substrate;
manufacturing several first thin film transistors and several second thin film transistors on the substrate, wherein the step of manufacturing several first thin film transistors and second thin film transistors comprises:
manufacturing a first gate electrode layer of the first thin film transistors;
manufacturing a layer of gate electrode insulation material on the first gate electrode layer, wherein the gate electrode insulation material is silicon nitride material;
etching the gate electrode insulation material and a first insulation layer to form a contact hole corresponding to a first active layer and a metal layer, and annealing at a temperature from 350 to 400 degrees Celsius;
manufacturing a second gate electrode layer of the first thin film transistors and a third gate electrode layer of the second thin film transistors on the gate electrode insulation material; and
etching the gate electrode insulation material by using self-alignment of the second gate electrode layer and the third gate electrode layer, and acquiring a gate electrode insulation layer;
wherein after the step of acquiring the gate electrode insulation layer, the method further comprises steps as follows:
manufacturing a first dielectric layer on the first insulation layer, wherein the first dielectric layer covers the first gate electrode layer, the gate electrode insulation layer, the second gate electrode layer, and the third gate electrode layer;
manufacturing a second active layer of the second thin film transistors on the first dielectric layer;
manufacturing a layer of a second insulation layer on the first dielectric layer, wherein the second insulation layer covers the second active layer;
manufacturing a fourth gate electrode layer on the second insulation layer, wherein the fourth gate electrode layer corresponds to the third gate electrode layer;
manufacturing a second dielectric layer on the second insulation layer, wherein the second dielectric layer covers the fourth gate electrode layer;
etching the second dielectric layer, the second insulation layer, the first dielectric layer, and the first insulation layer to form several first via holes and second via holes, wherein the first via holes correspond to the first active layer of the first thin film transistors, and the second via holes correspond to the metal layer and the second active layer of the second thin film transistors; and
manufacturing a first source and drain electrode and a second source and drain electrode on the second dielectric layer, wherein the first source and drain electrode penetrates the first via holes and is connected to the first active layer, and the second source and drain electrode penetrates the second via holes and is connected to the metal layer and the second active layer.

6. A display device, comprising a color filter substrate, an array substrate, and a backlight module, wherein the array substrate comprises:
a substrate;
a plurality of first thin film transistors disposed on the substrate, the first thin film transistors comprising a first gate electrode layer and a second gate electrode layer, and the second gate electrode layer disposed on a side of the first gate electrode layer away from the substrate;
a plurality of second thin film transistors disposed on the substrate, the second thin film transistors comprising a third gate electrode layer; and
a gate electrode insulation layer disposed between the first gate electrode layer and the second gate electrode layer and on a surface of a side of the third gate electrode layer near the substrate, the gate electrode insulation layer being silicon nitride material;

wherein the first thin film transistors further comprise:
- a first active layer disposed on the substrate, a first insulation layer covering the first active layer;
- the first gate electrode layer disposed on a surface of a side of the first insulation layer away from the substrate;
- the gate electrode insulation layer disposed on a surface of a side of the first gate electrode layer away from the first insulation layer;
- the second gate electrode layer disposed on a surface of a side of the first gate electrode layer away from the gate electrode insulation layer;
- a first dielectric layer disposed on the surface of the side of the first insulation layer away from the substrate and covering the first gate electrode layer, the gate electrode insulation layer, and the second gate electrode layer; and
- a first source and drain electrode disposed on a surface of a side of a second dielectric layer away from the second insulation layer, and connected to the first active layer;

wherein the second thin film transistor further comprises:
- a metal layer disposed on the substrate and disposed on a same layer as a first active layer;
- the third gate electrode layer disposed on the gate electrode insulation layer;
- a second active layer disposed on a surface of a side of the first dielectric layer away from a first insulation layer, a second insulation layer covering the second active layer;
- a fourth gate electrode layer disposed on a surface of a side of the second insulation layer away from the first dielectric layer, a second dielectric layer covering the fourth gate electrode layer; and
- a second source and drain electrode disposed on a surface of a side of a second dielectric layer away from the second insulation layer, and connected to the second active layer and the metal layer.

7. The display device according to claim 6, wherein the array substrate further comprises a passivation layer, and the first insulation layer, the first dielectric layer, the second insulation layer, the second dielectric layer, and the passivation layer are sequentially stacked on one another.

8. The display device according to claim 6, wherein the array substrate further comprises:
- a first planarization layer disposed on a surface of a side of a passivation layer away from a second dielectric layer;
- a pixel electrode disposed on a first planarization layer, and partially penetrating the first planarization layer to connect with a first source and drain electrode;
- a second planarization layer disposed on a surface of a side of the first planarization layer away from the passivation layer and covering the pixel electrode;
- a pixel definition layer disposed on a surface of a side of the second planarization layer away from the first planarization layer, and a pixel hole is defined in a portion of the pixel definition layer corresponding to the pixel electrode; and
- a light emitting layer disposed in the pixel hole and connected to the pixel electrode.

9. The display device according to claim 8, wherein the array substrate further comprises a displaying region and a folding region; the first thin film transistors and the second thin film transistors are disposed in the displaying region; the substrate, the first insulation layer, the first dielectric layer, the second insulation layer, the second dielectric layer, and the passivation layer extend from the displaying region into the folding region; and
- a hole is defined in the folding region, the hole penetrates the passivation layer, the second dielectric layer, the second insulation layer, the first dielectric layer, the first insulation layer, and a portion of the substrate, and the first planarization layer is filled in the hole.

* * * * *